United States Patent
Stoller

(10) Patent No.: US 6,877,551 B2
(45) Date of Patent: Apr. 12, 2005

(54) SYSTEMS AND METHODS FOR WEATHERPROOF CABINETS WITH VARIABLY COOLED COMPARTMENTS

(75) Inventor: Harry R. Stoller, Basking Ridge, NJ (US)

(73) Assignee: Avaya Technology Corp., Basking Ridge, NJ (US)

(*) Notice: Subject to any disclaimer, the term of this patent is extended or adjusted under 35 U.S.C. 154(b) by 20 days.

(21) Appl. No.: 10/193,556

(22) Filed: Jul. 11, 2002

(65) Prior Publication Data

US 2004/0007348 A1 Jan. 15, 2004

(51) Int. Cl.$^7$ ............................................ F25B 29/00
(52) U.S. Cl. .................... 165/47; 165/59; 165/122; 454/193
(58) Field of Search ..................... 165/47, 58, 59, 165/80.2, 122; 454/84, 193

(56) References Cited

U.S. PATENT DOCUMENTS

| | | | |
|---|---|---|---|
| 4,386,651 A | 6/1983 | Reinhard | 165/104.33 |
| 4,449,579 A | 5/1984 | Miyazaki et al. | 165/104.33 |
| 4,800,734 A | 1/1989 | Sauber et al. | 62/263 |
| 4,949,218 A | 8/1990 | Blanchard et al. | 361/384 |
| 5,035,281 A | 7/1991 | Neuenfeldt et al. | 165/76 |
| 5,040,095 A | 8/1991 | Beaty et al. | 361/384 |
| 5,150,277 A | 9/1992 | Bainbridge et al. | 361/384 |
| 5,467,250 A | 11/1995 | Howard et al. | 361/696 |
| 5,529,120 A | 6/1996 | Howard et al. | 165/166 |
| 5,570,740 A | 11/1996 | Flores et al. | 165/104.34 |
| 5,688,169 A | 11/1997 | Duong et al. | 454/184 |
| 5,697,840 A | 12/1997 | Bainbridge et al. | 454/184 |
| 5,832,988 A | 11/1998 | Mistry et al. | 165/103 |
| 5,950,446 A | 9/1999 | Tromblee et al. | 62/262 |
| 6,024,165 A | 2/2000 | Melane et al. | 165/104.33 |
| 6,067,223 A | 5/2000 | Diebel et al. | 361/676 |
| 6,082,441 A | 7/2000 | Boehmer et al. | 165/80.3 |
| 6,088,225 A | 7/2000 | Parry et al. | 361/704 |
| 6,119,768 A | 9/2000 | Dreier et al. | 165/104.33 |
| 6,149,254 A | 11/2000 | Bretschneider et al. | 312/223.1 |
| 6,164,369 A | 12/2000 | Stoller | 165/104.33 |
| 6,201,694 B1 | 3/2001 | Turunen | 361/695 |
| 6,704,198 B1 * | 3/2004 | Replogle et al. | 165/122 |

* cited by examiner

Primary Examiner—Ljiljana Ciric
(74) Attorney, Agent, or Firm—Thomas, Kayden, Horstemeyer & Risley, LLP

(57) ABSTRACT

Systems and methods for weatherproof cabinets with variably cooled compartments are provided. One such embodiment includes a housing having a door attached thereto, and in which a cooling compartment and a battery compartment are disposed. An electronics compartment is disposed within the cooling compartment, and an external fan is also disposed within the housing. Methods are also provided for transferring heat from inside the electronics compartment to the cooling compartment, from the cooling compartment to the outside of the housing, and from the battery compartment to the outside of the housing.

4 Claims, 6 Drawing Sheets

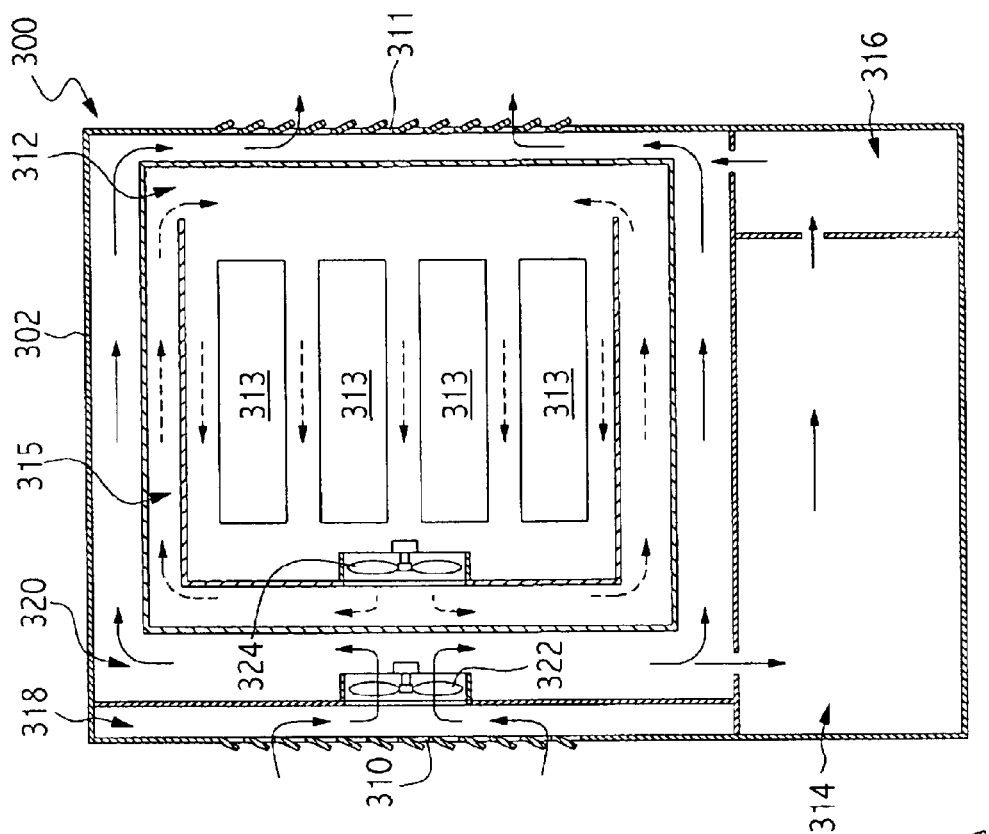
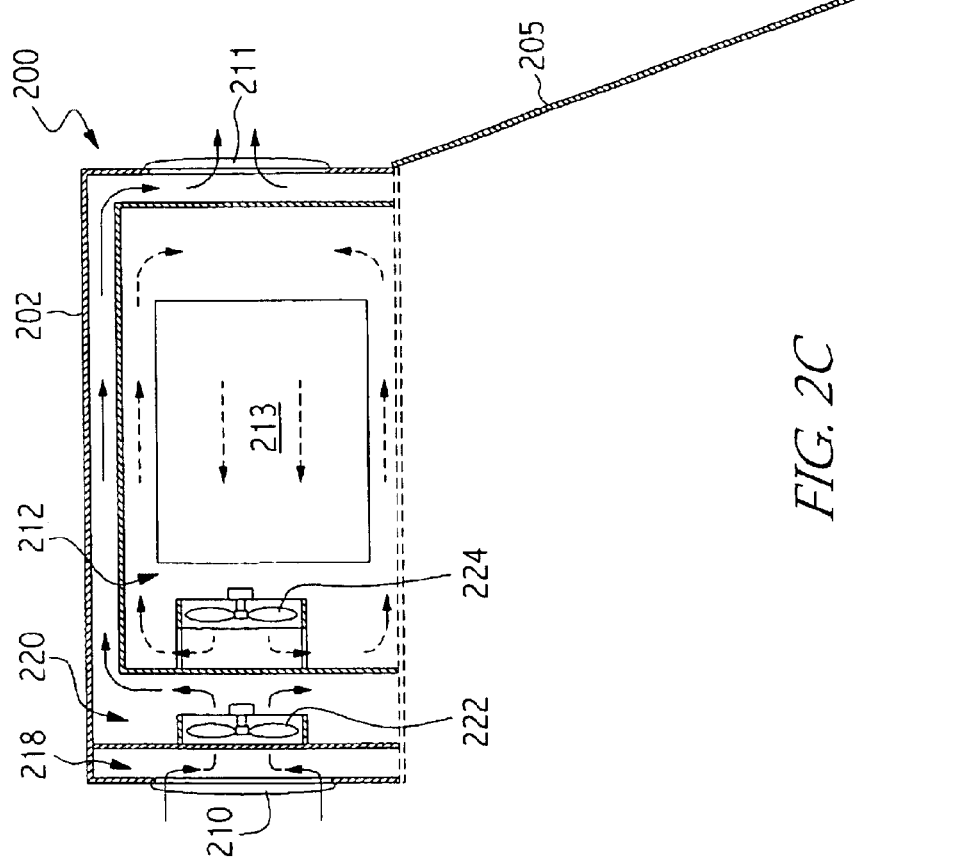
*FIG. 3*
*FIG. 2C*

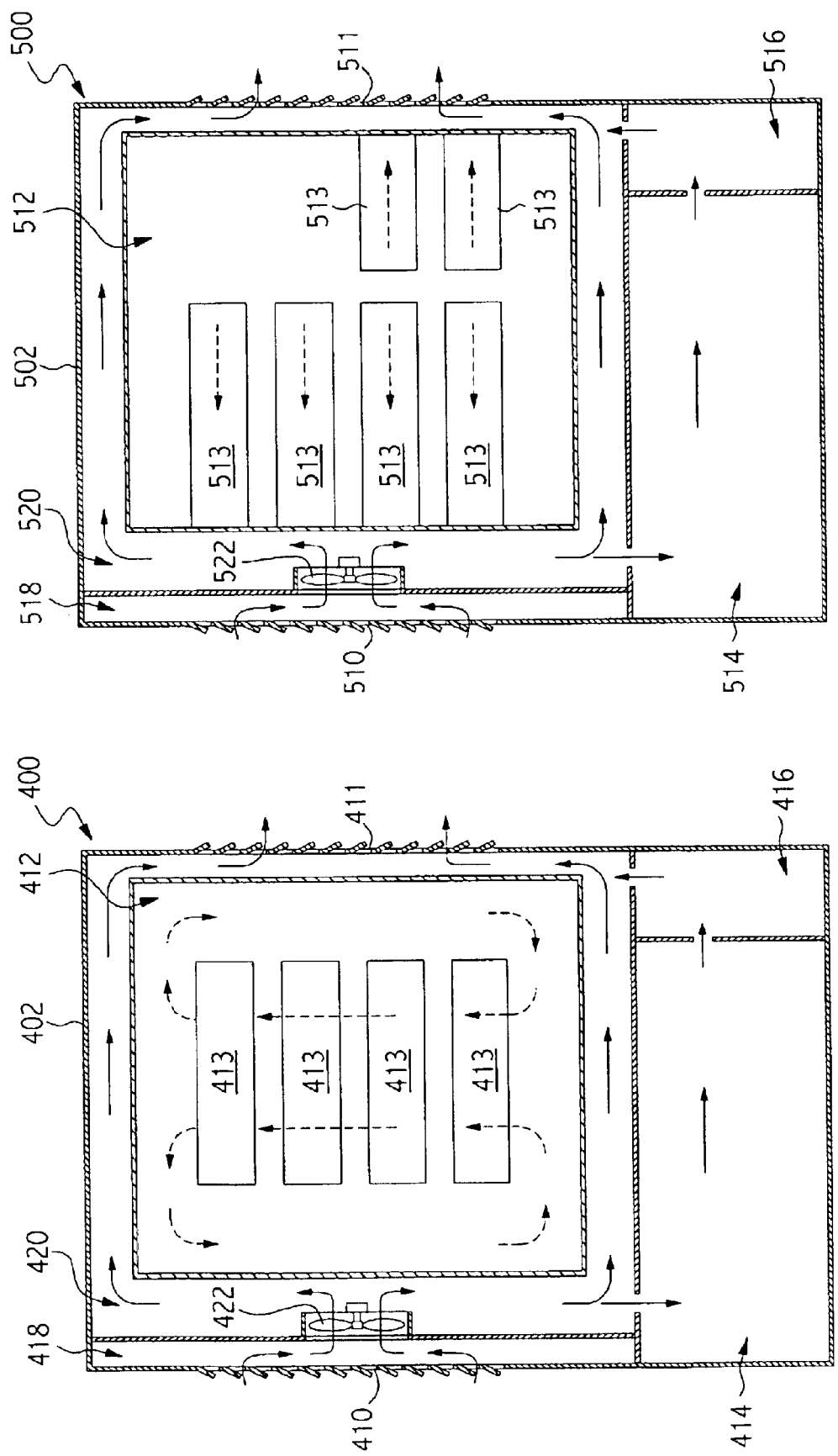

US 6,877,551 B2

SYSTEMS AND METHODS FOR WEATHERPROOF CABINETS WITH VARIABLY COOLED COMPARTMENTS

FIELD OF THE INVENTION

The present invention is generally related to telecommunications enclosures and, more particularly, is related to systems and methods for weatherproof cabinets with variably cooled compartments.

BACKGROUND OF THE INVENTION

The growing demand for telecommunications services has caused a corresponding increased demand for weatherproof cabinets that are capable of accommodating telecommunications equipment installed outdoors or in other weather exposed environments. Such cabinets are typically used to enclose electronic equipment along with batteries that provide backup power to the electronic equipment in the event that the normal power source (e.g., from a commercial utility) is interrupted. Modern telecommunications equipment, particularly newer generation electronic equipment and batteries, often require different ambient environments to function optimally. Thus, different ambient environments may need to be provided for such equipment within the same cabinet.

Existing cabinets have typically displayed shortcomings in the capability to provide different ambient environments needed to facilitate the optimal operation of modem telecommunications equipment. For example, some existing cabinets enclose electronic equipment and batteries in the same compartment and, thus, do not provide different ambient environments for this equipment. Other existing cabinets enclose equipment, such as the electronic equipment and the batteries, in different compartments, but fail to provide sufficient cooling of this equipment—thus, such cabinets also fail to provide the required ambient environments. Further, some existing cabinets also fail to prevent the undesirable accumulation of excessive particles and debris on enclosed equipment, such as the batteries, which may make maintenance and repairs difficult and may also contribute to decreased operating performance and life-span.

Based on the foregoing, it should be appreciated that there is a need for improved systems and methods which address the above-mentioned, as well as other, shortcomings of existing systems and methods.

SUMMARY OF THE INVENTION

The present invention provides systems and methods for weatherproof cabinets with variably cooled compartments.

Briefly described, one embodiment of the system, among others, includes a housing. A door is attached to the housing. Disposed within the housing is a cooling compartment and a battery compartment. An electronics compartment is disposed within the cooling compartment. Additionally, an external fan is disposed within the housing.

The present invention can also be viewed as providing methods for weatherproof cabinets with variably cooled compartments. In this regard, one embodiment of such a method, among others, can be broadly summarized by the following: providing a weatherproof cabinet with multiple compartments, transferring heat from an electronics compartment to the exterior of the compartment, transferring heat from the exterior of the electronics compartment to outside of the cabinet, and transferring heat from a battery compartment to outside of the cabinet.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 2C is a cutaway top view of an alternate embodiment of a weatherproof cabinet with variably cooled compartments such as that depicted in FIG. 2A that has a single-walled door.

FIG. 3 is a cutaway front view of a first alternate embodiment of a weatherproof cabinet with variably cooled compartments such as that depicted in FIG. 1 that has an internal duct.

FIG. 4 is a cutaway front view of a second alternate embodiment of a weatherproof cabinet with variably cooled compartments such as that depicted in FIG. 1 that has a compartment cooled by natural convection.

FIG. 5 is a cutaway front view of a third alternate embodiment of a weatherproof cabinet with variably cooled compartments such as that depicted in FIG. 1 that has a compartment cooled by conduction.

DETAILED DESCRIPTION

The invention now will be described more fully with reference to the accompanying drawings. The invention may, however, be embodied in many different forms and should not be construed as limited to the embodiments set forth herein; rather, these embodiments are intended to convey the scope of the invention to those skilled in the art. Furthermore, all "examples" given herein are intended to be non-limiting.

Figure 1:
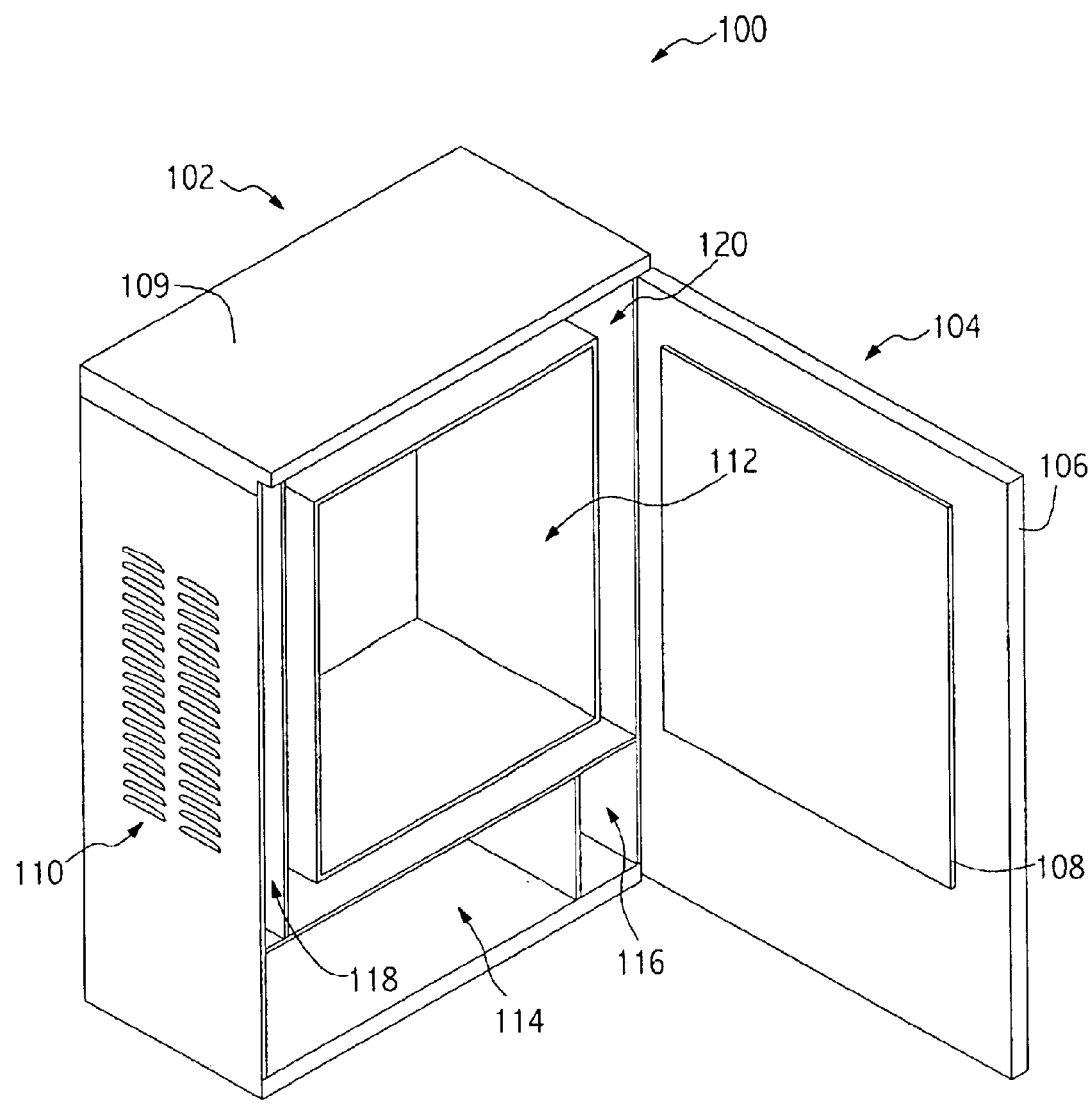
FIG. 1 is a perspective view of a weatherproof cabinet with variably cooled compartments in accordance with the invention.

Referring now to FIG. 1, a perspective view of a weatherproof cabinet 100 with variably cooled compartments is shown. The cabinet 100 includes a housing 102 and a door or cover 104. Although not depicted, in some embodiments, the cabinet 100 may include more than one door—for example, the cabinet 100 may include one or more doors on opposite sides of the cabinet 100 or adjacent to each other on the same side of the cabinet 100. The housing 102 typically has several walls of various shapes and sizes as depicted, for example, in FIG. 1. The door 104 is typically attached to one or more walls of the housing 102 by some means for attachment, such as hinges, screw fasteners, or other elements, which may be known in the art. The door 104 may include one or more walls of various sizes and shapes. For example, as shown in FIG. 1, the door 104 may have a double-walled construction that includes an outer wall 106 and an inner wall 108. Further, the inner wall 108 may be spaced from the outer wall 106 by some means for spacing, such as "I"-shaped spacers, "Z"-shaped spacers, spacer-bolt assemblies, spacer columns, or other elements, which may be known in the art. In this regard, the inner wall 108 and outer wall 106 may be at least substantially thermally independent such that there is a substantial absence of thermal transfer between the surfaces of the walls 106, 108. For example, solar heating of the cabinet 100 will typically not result in substantial heat transfer from the outer door wall 106 to the inner door wall 108. In some embodiments, the outer wall 106 and inner wall 108 may be separate assemblies.

The walls of the housing 102 may include one or more vents 110. For example, as depicted in FIG. 1, the side walls of the housing 102 may have a plurality of vents 110 (the vents 110 on the right-side wall are not depicted in FIG. 1). The vents 110 may alternately be included on one or more other walls of the housing 102, instead of the side walls, or additional vents (not depicted) may be included on other walls of the housing 102 as well. The vents 110 may be provided in various sizes, shapes, and configurations. Typically, the vents 110 provide one or more openings in the side walls that allow the through-flow of air. Moreover, the vents 110 may be shaped or otherwise configured to minimize the ingress of moisture and debris into the cabinet 100, for example, in the form of wind-swept rain, dust, or other particles. The vents 110 may also be at least partially covered by some means for filtering (not depicted), such as filter media, screening, or other elements, which may be known in the art, to minimize the ingress of moisture and debris into the cabinet 100.

In order to facilitate the weatherproof characteristics of the cabinet 100, the housing 102 and door 104 may include other features that promote such characteristics. For example, as depicted in FIG. 1, the top wall 109 of the housing 102 may extend over the door 104 when it is in a closed position in order to minimize the accumulation and possible ingress of moisture, for example from rain or snow, at the top section where the closed door 104 and housing 102 meet. As another example, the door 104 and/or the surface of the housing 102 that contacts the door 104 when it is closed may include some means for sealing (not depicted) the cabinet 102, such as one or more gaskets, seals, or other elements, which may be known in the art. Other elements that facilitate the weatherproof characteristics of the cabinet 102, and which may be known in the art, may be included as part of the cabinet 102 within the scope of the invention.

As depicted in FIG. 1, the interior of the cabinet 100 may include several compartments. The cabinet 100 typically includes a main compartment 112 that usually serves to enclose electronic equipment that is installed in the cabinet 100. This main compartment 112 is typically formed of one or more separate walls from the walls that form the housing 102, and the main compartment 112 may be spaced from other walls and/or compartments within the housing 102 by some means for spacing, such as those discussed above with respect to the walls of the door 104. As a result, the main compartment 112 may be substantially thermally independent from other compartments and/or walls of the cabinet 102. For example, solar heating of the cabinet 100 will typically not result in substantial heat transfer from the walls of housing 102 to the walls of the main compartment 112, which might interfere with the cooling of enclosed electronic equipment. The main compartment 112 typically provides full enclosure, which may include a water-tight and/or air-tight environment, of equipment installed within it when the main compartment 112 is closed. In this regard, a wall of the main compartment 112, such as the front wall, may be provided by the inner wall 108 of the door 104. In this manner, the interior space of the main compartment 112 can be accessed, for example to access equipment installed within the main compartment 112, when the door 104 of the cabinet 100 is open. Alternately, for example, a wall of the main compartment 112, such as the front wall, may be provided by a separate wall panel (not depicted) that is attached to the main compartment 112 by some means for attachment, such as those discussed above with respect to the door 104.

Although not depicted in FIG. 1, in some embodiments of the cabinet 100, one or more walls of the main compartment 112 may be provided by a single walled door (not depicted) which also provides a wall to other compartments of the housing. Additionally, the walls of the main compartment 112 may include one or more openings that are fitted with some means for connecting (not depicted), such as a cable connector, a strain relief cable connector, or other components, which may be known in the art. Such means for connecting may facilitate the passage of cables into the main compartment 112 and, in that regard, may also provide a seal or barrier between the main compartment 112 and other compartments of the cabinet 100.

The cabinet 100 typically also includes an auxiliary compartment 114 that usually encloses batteries and related equipment. As depicted in FIG. 1, one or more walls of the auxiliary compartment 114 may be formed from the walls of the housing 102. Moreover, the outer wall 106 of the door 104 typically serves as a wall, such as the front wall, of the auxiliary compartment 114, although in some embodiments, a separate wall may be provided and attached to the compartment 114, for example, by some means for attachment as discussed above.

An entrance compartment 116 is also typically included in the cabinet 100. The entrance compartment 116 typically provides a location on the cabinet 100 where one or more power cables, telecommunications cables, and/or other components can be routed into the cabinet 100, for example, from one or more conduits or a trench. In that regard, the bottom wall of the entrance compartment 116 typically has one or more openings (not depicted) for cables and/or other components to be passed through and into the cabinet 100. Furthermore, other walls of the entrance compartment 116 may also have openings (not depicted) so that cables or other components can be routed to other compartments within the cabinet 100. As depicted in FIG. 1, one or more walls of the entrance compartment 116 may be formed from the walls of the housing 102. Further, the outer wall 106 of the door 104 typically serves as a wall, such as the front wall, of the entrance compartment 116, although in some embodiments, a separate wall may be provided and attached to the compartment 116, for example, by some means for attachment as discussed above.

A cooling compartment 120 is also a typical feature of the cabinet 100. As depicted in FIG. 1, the cooling compartment 120 typically surrounds the main compartment 112. In that regard, the cooling compartment 120 typically serves to circulate air around the walls of the main compartment 112 to facilitate thermal transfer, such as cooling, from the main compartment 112. Typically, the outer wall 106 of the door 104 serves as a wall, such as the front wall, of the cooling compartment 120, and one or more walls of the housing 102 may form the other walls of the cooling compartment 120, as shown.

In some embodiments, the cabinet 100 may also include a vent compartment 118, as depicted for example in FIG. 1. The vent compartment 118 typically includes at least one wall of the housing 102 that has vents 110. In that regard, the vent compartment 118 may serve as an air plenum when air enters or exits the vent compartment 118 through the vents 110. As will be discussed further below with respect to other figures, the walls of the vent compartment 118 typically have additional openings, besides the vents 110, to facilitate the movement of air through the cabinet 100. It is noted that some embodiments (not shown) of the cabinet 100 may not include a vent compartment 118—in such embodiments, the vents 110 may provide several openings directly into the cooling compartment 120 to facilitate the flow of air through the cabinet 100.

The cabinet 100 may also include other compartments that serve various purposes within the scope of the invention. The various elements of the cabinet 100, such as the walls of the housing 102 and the door 104, may be constructed of various materials, such as metal, plastic, or other materials, which may be known in the art. Factors such as thermal characteristics, strength, and durability, for example, may affect the type of materials that the various elements of the cabinet 100 are constructed from.

Figures 2A, 2B:
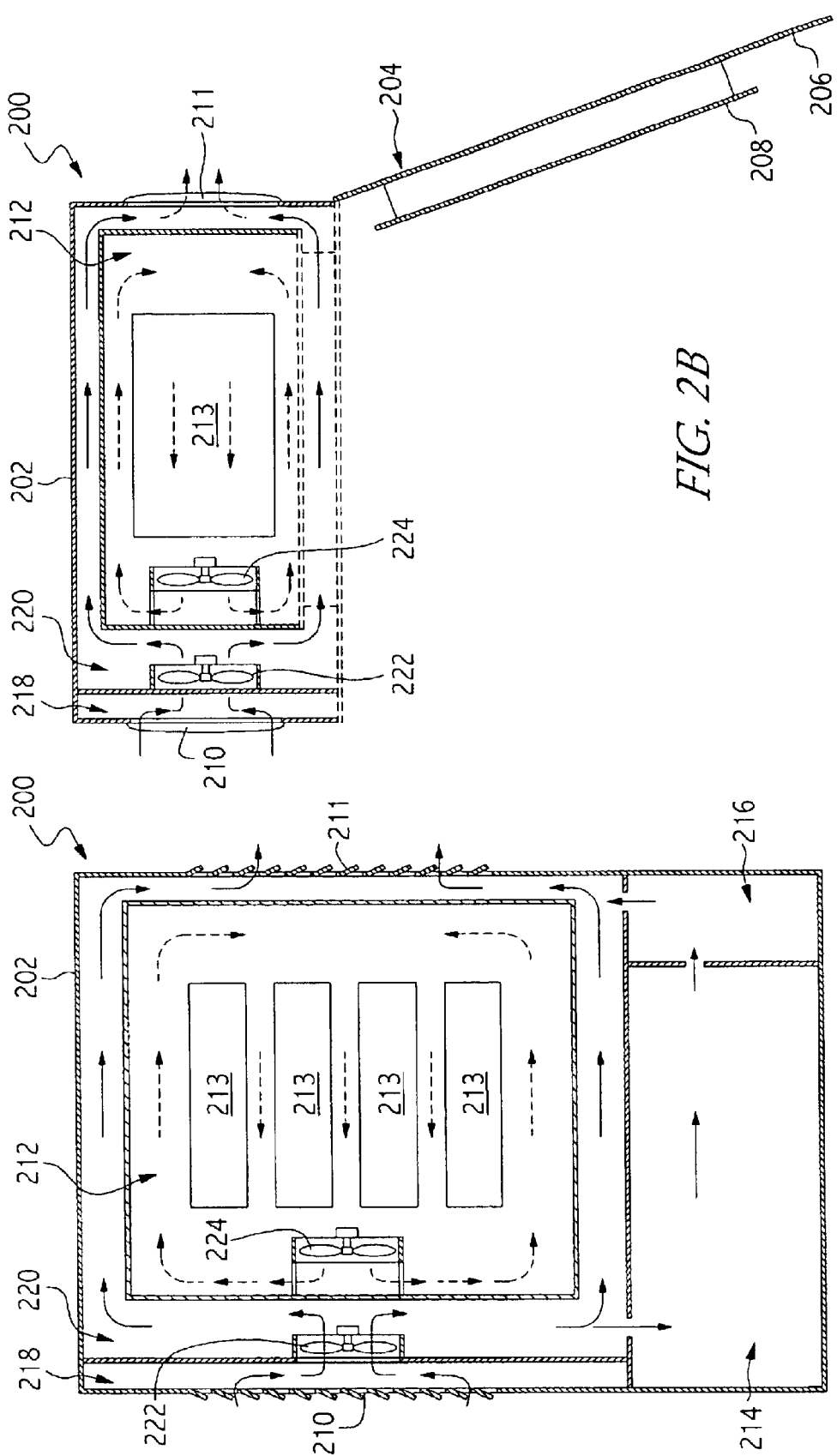
FIG. 2A is a cutaway front view of an embodiment of a weatherproof cabinet with variably cooled compartments such as that depicted in FIG. 1.
FIG. 2B is a cutaway top view of an embodiment of a weatherproof cabinet with variably cooled compartments such as that depicted in FIG. 2A that has a double-walled door.

FIG. 2A shows a cutaway front view of a weatherproof cabinet 200 with variably cooled compartments that has many substantially similar characteristics to the cabinet 100 discussed with respect to FIG. 1. The cabinet 200 has a housing 202 which typically surrounds various compartments within the cabinet 200. The housing 202 has substantially similar characteristics to the housing 102 described above with respect to FIG. 1. In that regard, each side wall of the housing 202 typically includes one or more left-side vents 210 and right-side vents 211, as depicted in FIG. 2, which are substantially similar to the vents 110 described above.

The cabinet 200 includes an electronics compartment 212 which typically holds electronic equipment 213, such as telecommunications equipment. The electronics compartment 212 typically has substantially similar characteristics to the main compartment 112 discussed above with respect to FIG. 1. For example, the electronics compartment 212 is typically formed of separate walls from those that form the other compartments of the cabinet 200. Further, the electronics compartment 212 typically provides full enclosure of the electronic equipment 213 when the electronics compartment 212 is closed.

The cabinet 200 also typically includes a battery compartment 214 which typically holds one or more batteries and related equipment. The battery compartment 214 is typically substantially similar in characteristics to the auxiliary compartment 114 discussed above with respect to FIG. 1. As depicted in FIG. 2, one or more walls of the battery compartments may have openings in them to allow air or other gaseous flow through the battery compartment 214, for example hydrogen produced by batteries—this feature will be discussed further below.

A cable entrance compartment 216 is also typically included in the cabinet 200.

The cable entrance compartment 216 has substantially similar characteristics to the entrance compartment 116 discussed above for FIG. 1. For example, the cable entrance compartment 216 typically provides a location where one or more power cables, telecommunications cables, and/or other components can be routed into the cabinet 200. The cable entrance compartment 216 may also include one or more openings in the walls of the compartment 216 to facilitate the flow of air through the cabinet 200.

The cabinet 200 also typically includes a vent compartment 218 which has substantially similar characteristics to the vent compartment 118 discussed with regard to FIG. 1. In that regard, the vent compartment 218 may serve as an air plenum when air enters or exits the vent compartment 218 through the left-side vents 210. The cabinet 200 also typically includes a cooling compartment 220 that is substantially similar to the cooling compartment 120 discussed above in FIG. 1. Thus, the cooling compartment 220 typically surrounds the electronics compartment 212, as depicted, and serves to circulate air around the walls of the electronics compartment 212 to facilitate thermal transfer, such as for cooling, from the electronics compartment 212.

In addition to the various elements discussed above, the cabinet 200 also typically includes one or more external fans 222. The external fans 222 may be provided by various types and configurations of fans which may be known in the art. Typically, the external fans 222 have at least a motor and one or more fan blades. Further, the external fans 222 are typically mounted at or near an opening in the wall between the vent compartment 218 and the cooling compartment 220 by some means for mounting (not depicted), such as bolts, studs, or other elements which may be known in the art. The external fans 222 may be powered by electrical power provided to the cabinet 200 by various means. For example, power may be provided by one or more power cables that pass into the cabinet 200 at the cable entrance compartment 216 or by one or more batteries which are installed in the battery compartment 214. Although the external fans 222 may operate to either push air into or pull air out of the cooling compartment 220, in this embodiment of the cabinet 200, the external fans 222 typically operate to push air into the cooling compartment 220.

As depicted by the solid flow lines in FIG. 2A, the external fans 222 typically cause air to flow through the left-side vents 210 into the vent compartment 218 and subsequently into the cooling compartment 220. Further, as depicted by the solid flow lines, the external fans 222 typically cause air to move through the cooling compartment 220, passing around the walls of the electronics compartment 212. The external fans 222 also typically cause air to flow into and through the battery compartment 214. The external fans 222 may also cause air to flow through the cable entrance compartment 216. As depicted by the solid flow lines in FIG. 2A, the external fans 222 typically cause air that flows through the cooling compartment 220 and/or the battery compartment 214 to exit the cabinet 200 through the right-side vents 211.

The air flow through the battery compartment 214, and possibly through the cable entrance compartment 216, passes through one or more openings in the walls of the compartments. For example, as depicted in FIG. 2A, air may enter the battery compartment 214 through one or more openings in the wall between the cooling compartment 220 and the battery compartment 214, and air may exit the battery compartment 214 through one or more openings in the wall between the battery compartment 214 and the cable entrance compartment 216. Further, the air flow through the battery compartment 214 and the cable entrance 216 may then enter back into the cooling compartment 220 through one or more openings in the wall between the cable entrance compartment 216 and the cooling compartment 220. As depicted by the solid flow lines in FIG. 2A, the flow of external air through the cabinet 200 is generally through the left-side vents 210, into the vent compartment 218, into the cooling compartment 220, into the battery compartment 214 and the cable entrance compartment 216, and finally, out of the cooling compartment 220 through the right-side vents 211.

Although not depicted in FIG. 2A, variations of the flow of external air from that in the foregoing description may occur. For example, external air may flow in and out of the battery compartment 214 through one or more openings in the wall between the battery compartment 214 and the cooling compartment 220 without flowing through the cable entrance compartment 216. Typically, the main flow of external air through the cabinet 200 flows through the cooling compartment 200, while a lesser flow of external air flows through the battery compartment 214 and possibly through the cable entrance compartment 216. The volume and pressure of the external air that flows through the battery compartment may be varied by varying the size and/or shape of the openings that lead in and/or out of the battery compartment 214. In that regard, the flow of external air through the battery compartment 214 may be varied to reduce or prevent the undesirable accumulation of excessive particles and debris on equipment enclosed in the battery compartment 214 and to control the amount of cooling supplied to the battery compartment 214. Thus, the amount of cooling supplied to the battery compartment 214 may be varied from the amount of cooling supplied to other compartments of the cabinet 200, such as the electronics compartment 212.

The flow of external air through the cooling compartment 220, as depicted by the solid flow lines in FIG. 2A, typically facilitates the cooling of the electronic equipment 213 enclosed within the electronics compartment 212. In that regard, the cabinet 200 typically also includes one or more internal fans 224. Similar to the external fans 222 described above, the internal fans 224 may be provided by various types and configurations of fans which may be known in the art. Furthermore, the internal fans 224 also have at least a motor and one or more fan blades. The internal fans 224 are typically mounted in the electronics compartment 212 by some means for mounting (not depicted), such as bolts, studs, or other elements which may be known in the art. Moreover, similar to the external fans 222, the internal fans 224 may be powered by electrical power provided to the cabinet 200 by various means, such as by one or more power cables that pass into the cabinet 200 at the cable entrance compartment 216 or by one or more batteries which are installed in the battery compartment 214.

As depicted by the dashed flow lines in FIG. 2A, the internal fans 224 typically circulate air within the electronics compartment 212. In that regard, the internal fans 224 typically cause internal air to circulate around the electronic equipment 213 enclosed within the electronics compartment 212. This circulation of internal air typically causes the transfer of heat generated by the electronics equipment 213 to the walls of the electronics compartment 212. Thus, the circulation of air around the electronics equipment 213 by the internal fans 224 provides cooling to the electronics equipment 213. The heat that is transferred to the walls of the electronics compartment 212 is typically transferred out of the cabinet 200 by the external air flow that circulates across the walls of the electronics compartment 212 in the cooling compartment 220, as depicted by the solid flow lines. Thus, further cooling is provided to the electronics equipment 213 by the flow of external air through the cooling compartment 220.

The cooling provided to the electronics compartment 212 and to other compartments of the cabinet 200, such as the battery compartment 214, may also be varied by varying the rotation speed of the external fans 222 and/or the internal fans 224. Moreover, cooling to the various compartments of the cabinet 200 may also be varied by cycling the operation of the external fans 222 and/or internal fans 224 on and off for various time durations. In that regard, the operation of the external fans 222 and/or internal fans 224 may, for example, be activated dependent on the temperature in one or more compartments of the cabinet 200. When the external fans 222 and/or the internal fans 222 are off, the compartments may still be provided with some cooling. For example, heat from the compartments may be transferred out of the cabinet 200 through the vents 210, 211. Furthermore, gases and/or other byproducts generated by equipment held in one or more of the compartments of the cabinet 200, for example hydrogen from the batteries held in the battery compartment 214, may be vented through one or more openings in the walls of compartments and subsequently out of the cabinet 200 through the vents 210, 211.

FIGS. 2B and 2C show cutaway top views of embodiments of the weatherproof cabinet 200 described above with respect to FIG. 2A. FIG. 2B shows an embodiment of the cabinet 200 that includes a double-walled door 204. The double-walled door 204 is substantially similar in characteristics to the door 104 described above with respect to FIG. 1. In that regard, the double-walled door 204 includes an outer wall 206 and an inner wall 208. As depicted, the inner wall 208 may serve as the front wall of the electronics compartment 212. Further, the outer wall 206 typically serves as the front wall of the cabinet 200. FIG. 2C shows an alternate embodiment of the cabinet 200 that includes a single-walled door 205. In the embodiment of FIG. 2C, the door 205 typically serves as the front wall of the cabinet 200 and may also serve as the front wall of the electronics compartment 212, as depicted. In that regard, the door 205 has substantially similar characteristics to the outer wall 106 of the door 104 discussed above for FIG. 1.

FIG. 3 is a cutaway front view of a first alternate embodiment of a weatherproof cabinet 300 with variably cooled compartments such as that depicted in FIG. 1 that has an internal duct. In that regard, the cabinet 300 has many substantially similar characteristics to the cabinets 100 and 200 discussed above with respect to FIGS. 1 and 2A–2C respectively. The cabinet 300 includes a housing 302 with left-side vents 310 and right-side vents 311. The cabinet also includes an electronics compartment 312 which provides full enclosure to electronic equipment 313. Further, the cabinet includes a battery compartment 314, a cable entrance compartment 316, a vent compartment 318, and a cooling compartment 320. The foregoing compartments are at least substantially similar in characteristics to their named counterparts discussed above with respect to FIGS. 1, 2A–2C. Additionally, although not shown in FIG. 3, the cabinet 300 typically also includes at least either a single-walled or double-walled door that is similar to the doors discussed above for FIGS. 1, 2B–2C One or more external fans 322 and internal fans 324 are also included in the cabinet 300. These fans 322, 324 have at least substantially similar characteristics to the external and internal fans 222, 224 discussed above for FIG. 2. Moreover, the external and internal fans 322, 324 of the cabinet 300 cause substantially similar external and internal air flows to occur, as depicted by the solid flow lines and dashed flow lines respectively, as discussed above with respect to FIG. 2. Thus, the external and internal fans 322, 324 facilitate the variable cooling of various compartments of the cabinet 300, such as the electronics compartment 312 and the battery compartment 314, by the flow of external and internal air through the cabinet 300.

However, in this embodiment of the cabinet 300, there is also an internal duct 315 within the electronics compartment 312. As depicted by the dashed flow lines in FIG. 3, the internal duct 315 directs air that is circulated by the internal fans 324. The internal duct 315 typically directs air across the surfaces of the electronic equipment 313 and then across the inner surfaces of the electronics compartment 312 in a continuous circulation cycle. In that regard, the internal duct typically enhances and/or increases the cooling provided to the electronics equipment 313. The internal duct 315 also improves the operating efficiency of the internal fans 324, since air circulated by the fans is more effectively directed across the electronics equipment 313 and the walls of the electronics compartment to further facilitate the transfer of heat out of the electronics compartment 312.

Similar to the construction of other walls of the cabinet 300, the walls that form the internal duct 315 may be made of various materials, such as metal, plastic, or others materials, which may be known in the art. Further, similar to the spacing of the walls of the electronics compartment 312 within the cooling compartment 320, the walls of the internal duct 315 may be spaced from the walls of the electronics compartment 312 by some means for spacing, such as the elements discussed above with respect to the main compartment 112 of FIG. 1. This spacing typically facilitates the formation of the internal duct 315 in the form of, for example, a channel. The internal duct 315 may be shaped in various configurations, such as the substantially "U" shaped configuration depicted in FIG. 3, for example. Further, as depicted for example in FIG. 3, the internal duct 315 typically includes one or more openings at or near which the internal fans 324 are mounted in order to allow the circulation of air through the internal duct 315 by the internal fans 324.

FIG. 4 is a cutaway front view of a second alternate embodiment of a weatherproof cabinet 400 with variably cooled compartments such as that depicted in FIG. 1 that has a compartment cooled by natural convection. In that regard, the cabinet 400 also has many substantially similar characteristics to the cabinets 100 and 200 discussed above with respect to FIGS. 1 and 2A–2C respectively. The cabinet 400 includes a housing 402 with left-side vents 410 and right-side vents 411. The cabinet includes an electronics compartment 412 which provides full enclosure to electronic equipment 413. The cabinet also include a battery compartment 414, a cable entrance compartment 416, a vent compartment 418, and a cooling compartment 420. All of the foregoing compartments are at least substantially similar in characteristics to their named counterparts discussed above with respect to FIGS. 1, 2A–2C. Additionally, although not shown in FIG. 4, the cabinet 400 typically also includes at least either a single-walled or double-walled door that is similar to the doors discussed above for FIGS. 1, 2B–2C One or more external fans 422 are also included in the cabinet 400. These external fans 422 have at least substantially similar characteristics to the external fans 222 discussed above for FIG. 2. Moreover, the external fans 422 in the cabinet 400 cause substantially similar external air flow to occur through the cabinet 400, depicted for example by the solid flow lines, as discussed above with respect to FIG. 2. Thus, the external fans 422 facilitate the variable cooling of various compartments of the cabinet 400, such as the electronics compartment 412 and the battery compartment 414, by the flow of external air through the cabinet 400.

In variation from the cabinet 200 of FIG. 2, however, the cabinet 400 does not include internal fans which circulate air within the electronics compartment 412. Instead, in this embodiment of the cabinet 400, heat from the electronics equipment 413 is transferred to the walls of the electronics compartment 412 by natural convection of air, as depicted by the dashed flow lines in FIG. 4. The heat transferred to the walls of the electronics compartment 412 is typically transferred out of the cabinet 400 by the flow of external air through the cooling compartment 420 across the walls of the electronics compartment 412.

FIG. 5 is a cutaway front view of a third alternate embodiment of a weatherproof cabinet 500 with variably cooled compartments such as that depicted in FIG. 1 that has a compartment cooled by conduction. This embodiment of the cabinet 500 includes many substantially similar characteristics to the foregoing cabinet 400 discussed above with respect to FIG. 4 (and thus, also with respect to the cabinets 100 and 200 of FIGS. 1 and 2A–2C respectively). In that regard, the cabinet 500 includes a housing 502 with left-side vents 510 and right-side vents 511, an electronics compartment 512 which provides full enclosure to electronic equipment 513, a battery compartment 514, a cable entrance compartment 516, a vent compartment 518, and a cooling compartment 520. Additionally, although not shown in FIG. 5, the cabinet 500 typically also includes at least either a single-walled or double-walled door. The cabinet 500 also includes one or more external fans 522 that cause external air flow to occur, as depicted by the solid flow lines, to facilitate the variable cooling of various compartments of the cabinet 500, such as the electronics compartment 512 and the battery compartment 514.

In the cabinet embodiment 500 of FIG. 5, heat is transferred from the electronic equipment 513 to the walls of the electronics compartment 513 by direct conduction, as depicted by the dashed flow lines in FIG. 5. In this regard, the electronics equipment 513 is typically attached to or in contact with some means for heat transfer, such as heat sink devices or other elements which may be know in the art, which are also attached to or in contact with one or more walls of the electronics compartment 512. Similar to other embodiments of the cabinet 500, the heat transferred to the walls of the electronics compartment 512 is typically transferred out of the cabinet 500 by the flow of external air through the cooling compartment 520 across the walls of the electronics compartment 512.

Figure 6:
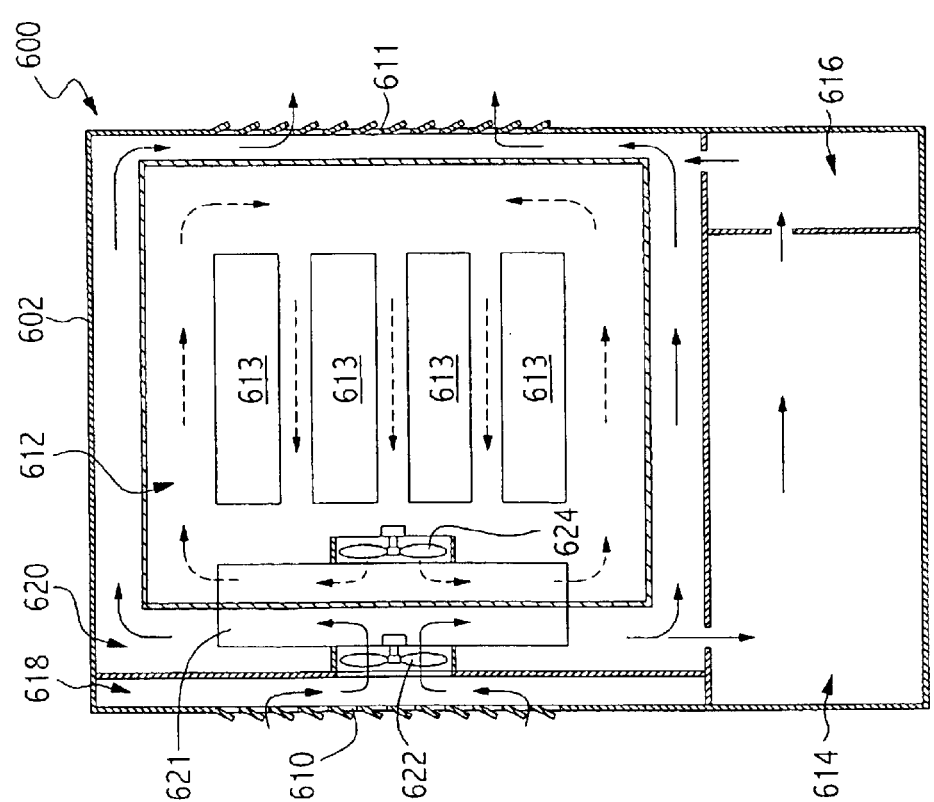
FIG. 6 is a cutaway front view of a fourth alternate embodiment of a weatherproof cabinet with variably cooled compartments such as that depicted in FIG. 1 that has heat exchanging elements.

FIG. 6 is a cutaway front view of a fourth alternate embodiment of a weatherproof cabinet 600 with variably cooled compartments such as that depicted in FIG. 1 that has heat exchanging elements. This embodiment of the cabinet 600 includes many substantially similar characteristics to the cabinet 200 discussed above with respect to FIG. 2. In that regard, the cabinet 600 includes a housing 602 with left-side vents 610 and right-side vents 611, an electronics compartment 612 which provides full enclosure to electronic equipment 613, a battery compartment 614, a cable entrance compartment 616, a vent compartment 618, and a cooling compartment 620. Additionally, although not shown in FIG. 6, the cabinet 600 typically also includes at least either a single-walled or double-walled door. The cabinet 600 also includes one or more external fans 622 and internal fans 624 that cause external and internal air flows to occur, as depicted by the solid flow lines and dashed flow lines respectively, to facilitate the variable cooling of various compartments of the cabinet 600, such as the electronics compartment 612 and the battery compartment 614.

In the cabinet 600, the transfer of heat from the electronics compartment 612 to the cooling compartment 620 is further facilitated by one or more heat exchanging elements 621. The heat exchanging elements 621 may include one or more extended or convoluted surfaces (such as fins), heat pipes, thermoelectric devices (for example that operate by Peltier effect), or other elements which may be known in the art. As depicted in FIG. 6, the heat exchanging elements 621 may extend between the electronics compartment 612 and the cooling compartment 620 to facilitate external and internal air flow across the elements 621. Typically, heat is transferred from the electronics equipment 613 to the heat exchanging elements 621 by the internal air flow (depicted by the dashed flow lines) that is circulated, for example, by the internal fans 624. The heat is then transferred out of the cabinet 600 by external air flow across the heat exchanging elements 621 that is circulated, for example, by the external fans 622. Additionally, heat transfer from the electronics compartment 612 may occur through the walls of the compartment 612.

Figure 7:
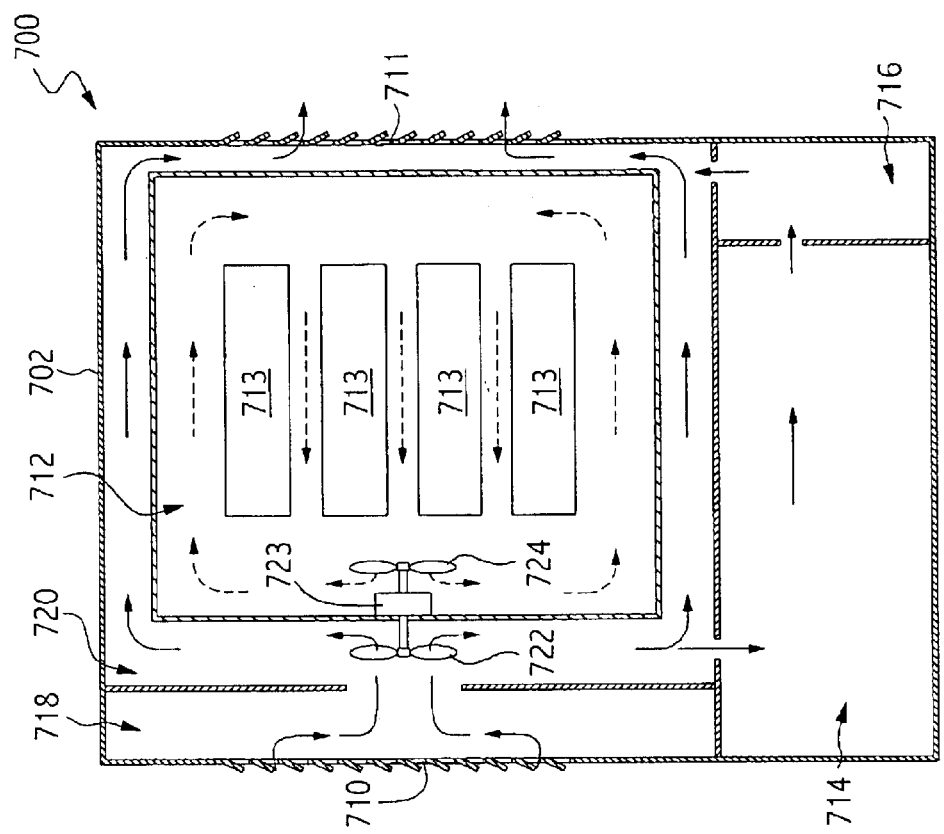
FIG. 7 is a cutaway front view of a fifth alternate embodiment of a weatherproof cabinet with variably cooled compartments such as that depicted in FIG. 1 that has common motor fans.

FIG. 7 is a cutaway front view of a fifth alternate embodiment of a weatherproof cabinet 700 with variably cooled compartments such as that depicted in FIG. 1 that has common motor fans. This embodiment of the cabinet 700 includes many substantially similar characteristics to the cabinet 200 discussed above with respect to FIG. 2. In that regard, the cabinet 700 includes a housing 702 with left-side vents 710 and right-side vents 711, an electronics compartment 712 which provides full enclosure to electronic equipment 713, a battery compartment 714, a cable entrance compartment 716, a vent compartment 718, and a cooling compartment 720. Additionally, although not shown in FIG. 7, the cabinet 700 typically also includes at least either a single-walled or double-walled door. The cabinet 700 also includes one or more external fans 722 and internal fans 724 that cause external and internal air flows to occur, as depicted by the solid flow lines and dashed flow lines respectively, to facilitate the variable cooling of various compartments of the cabinet 700, such as the electronics compartment 712 and the battery compartment 714.

In variation from the cabinet 200 of FIG. 2, the external fans 722 and internal fans 724 of the cabinet 700 typically share one or more common motors 723. For example, the blades of an external fan 722 and an internal fan 724 may be rotated by the same motor 723. As depicted, the common motor 723 may rotate a common shaft that rotates the external and internal fans 722, 724, but other variations, which may be known in the art, are included within the scope of the invention. The use of the common motors 723 to operate the external and internal fans 722, 724 may facilitate lower energy consumption for the operation of the fans 722, 724, lower heat production as a result of the operation of fewer fan motors, and lower costs of the fans 722, 724. The common fan motors 723 may be selectively mounted completely within the cooling compartment 720 or the electronics compartment 712 or partially between the compartments to facilitate the foregoing benefits, among others, in the operation of the common fan motors 723.

Figure 8:
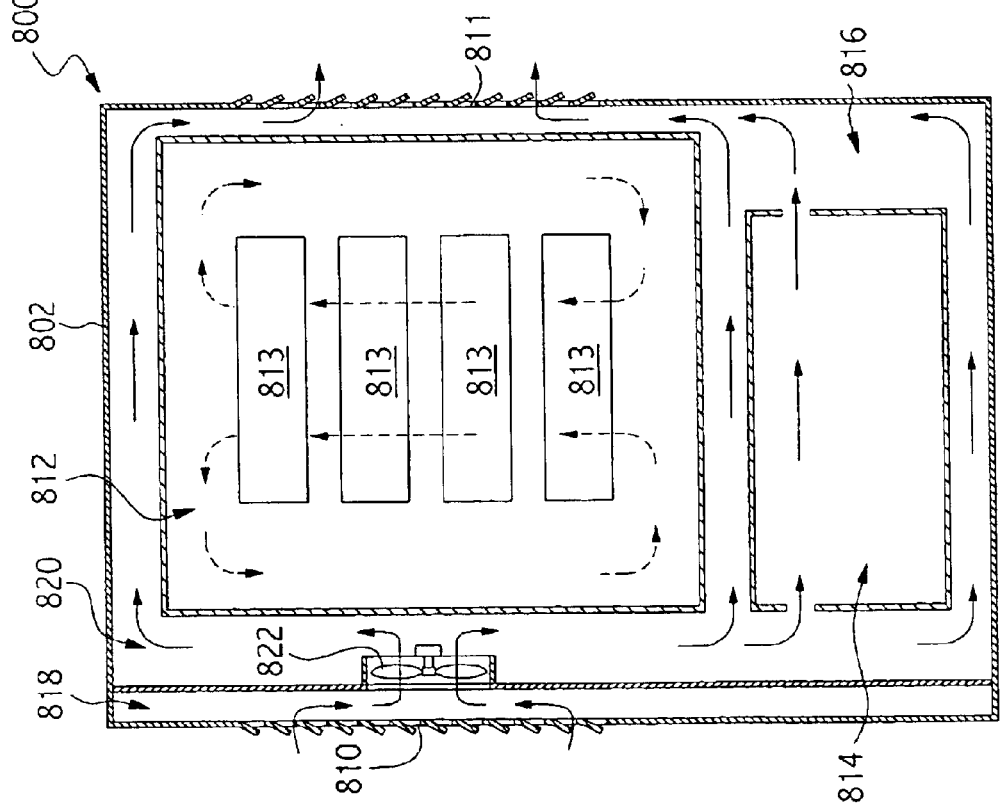
FIG. 8 is a cutaway front view of a sixth alternate embodiment of a weatherproof cabinet with variably cooled compartments such as that depicted in FIG. 1 that has a separate walled battery compartment.

FIG. 8 is a cutaway front view of a sixth alternate embodiment of a weatherproof cabinet 800 with variably cooled compartments such as that depicted in FIG. 1 that has a separate walled battery compartment. This embodiment of the cabinet 800 includes many substantially similar characteristics to the cabinet 400 discussed above with respect to FIG. 4. In that regard, the cabinet 800 includes a housing 802 with left-side vents 810 and right-side vents 811, an electronics compartment 812 which provides full enclosure to electronic equipment 813, a vent compartment 818, and a cooling compartment 820. Additionally, although not shown in FIG. 8, the cabinet 800 typically also includes at least either a single-walled or double-walled door, and the cabinet 800 may further include a cable entrance compartment similar to that described with respect to FIG. 4.

The cabinet 800 also includes one or more external fans 822 that cause external air flow to occur, as depicted by the solid flow lines, to facilitate the variable cooling of various compartments of the cabinet 800, such as the electronics compartment 812 and the battery compartment 814. Furthermore, heat from the electronics equipment 813 is transferred to the walls of the electronics compartment 812 by natural convection of air, as depicted by the dashed flow lines in FIG. 8—thereafter, the heat is typically transferred out of the cabinet 800 by the flow of external air through the cooling compartment 820 across the walls of the electronics compartment 812.

The cabinet embodiment 800 of FIG. 8 also includes a battery compartment 814, as do other embodiments. However, as depicted, the battery compartment 814 is typically spaced away from other walls of the compartments within the cabinet 800 by some means for spacing (not depicted) such as the elements discussed above with respect to the main compartment 112 of FIG. 1. In that regard, the battery compartment 814 is typically substantially thermally independent from other compartments and/or walls of the cabinet 800, similar to the electronics compartment 812.

As depicted by the solid flow lines on FIG. 8, cooling of the battery compartment 814 is facilitated by the flow of external air through the battery compartment 814 and across the walls of the battery compartment 814 within the cooling compartment 820. Typically, heat is transferred from batteries and other equipment enclosed within the battery compartment 814 to the walls of the compartment 814 by natural convection, although heat transfer may occur in other manners, such as those discussed above with respect to the electronics compartments of various embodiments or other manners which may be known in the art. The openings in the battery compartment 814 may also serve to vent gases, such as hydrogen, and/or other byproducts produced by the batteries and/or related equipment held within the battery compartment 814.

Figure 9:
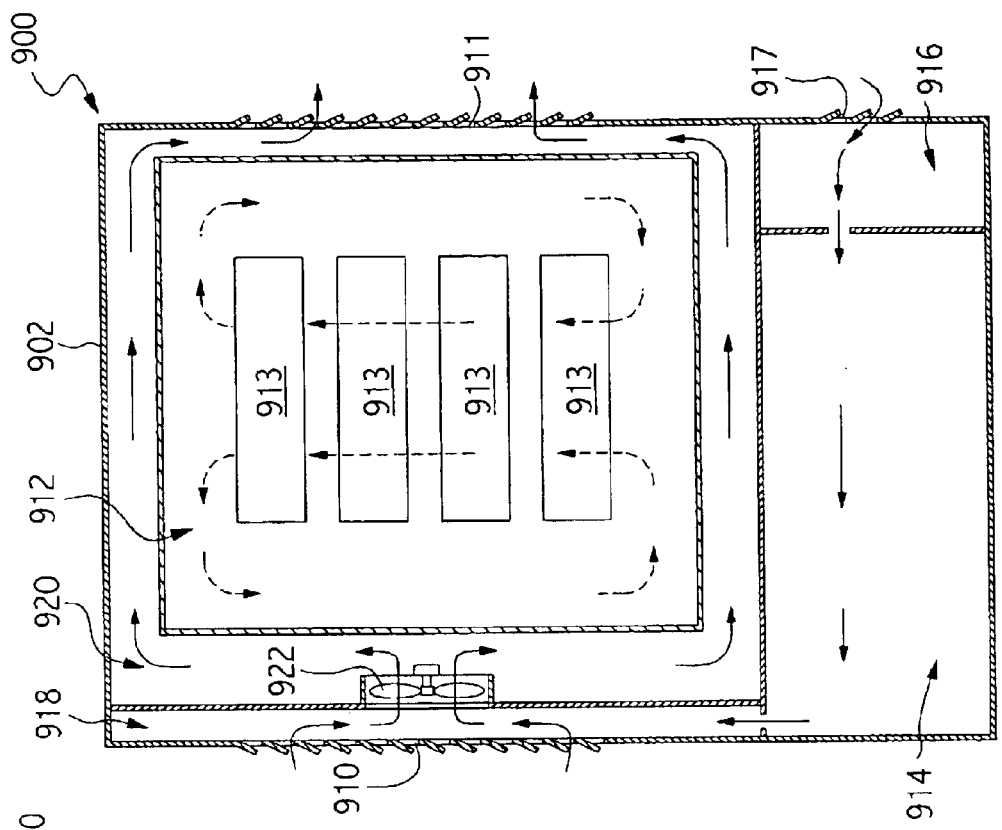
FIG. 9 is a cutaway front view of a seventh alternate embodiment of a weatherproof cabinet with variably cooled compartments such as that depicted in FIG. 1 that has pulled air cooling of the battery compartment.

FIG. 9 is a cutaway front view of a seventh alternate embodiment of a weatherproof cabinet 900 with variably cooled compartments such as that depicted in FIG. 1 that has pulled air cooling of the battery compartment. This embodiment of the cabinet 900 includes many substantially similar characteristics to the cabinet 400 discussed above with respect to FIG. 4. In that regard, the cabinet 900 includes a housing 902 with left-side vents 910 and right-side vents 911, an electronics compartment 912 which provides full enclosure to electronic equipment 913, a battery compartment 914, a cable entrance compartment 916, a vent compartment 918, and a cooling compartment 920. Additionally, although not shown in FIG. 9, the cabinet 900 typically also includes at least either a single-walled or double-walled door.

The cabinet 900 also includes one or more external fans 922 that cause external air flow to occur, as depicted by the solid flow lines, to facilitate the variable cooling of various compartments of the cabinet 900, such as the electronics compartment 912 and the battery compartment 914. Furthermore, heat from the electronics equipment 913 is transferred to the walls of the electronics compartment 912 by natural convection of air, as depicted by the dashed flow lines in FIG. 9. The heat transferred to the walls of the electronics compartment 912 is typically transferred out of the cabinet 900 by the flow of external air through the cooling compartment 920 across the walls of the electronics compartment 912.

In contrast to the pushed air flow through the battery compartment 414 of the cabinet 400, in the cabinet embodiment 900 of FIG. 9, air is pulled through the battery compartment 914 by the external fans 922. In that regard, the cabinet 900 also includes one or more secondary vents 917. The secondary vents 917 have substantially similar characteristics to the right-side and left-side vents 910, 911. For example, the secondary vents 917 may be provided in various sizes, shapes, and configurations as one or more openings in the walls of the cabinet 900. Additionally, the secondary vents 917 may be shaped or otherwise configured to minimize the ingress of moisture and debris into the cabinet 900, and the secondary vents 917 may also be at least partially covered by some means for filtering (not depicted), such as those discussed above with respect to the vents 110 of FIG. 1.

The cabinet 900 also facilitates the pulled air flow through the battery compartment 914 by one or more openings in the wall between the battery compartment 914 and the cable entrance compartment 916 as well as one or more openings in the wall between the battery compartment 914 and the vent compartment 918. In that regard, the operation of the external fans 922 typically causes air to be pulled into the cabinet 900 through the secondary vents 917, through the battery compartment 914 (and possibly through the cable entrance compartment 916, as depicted), and into the vent compartment 918 where the air may be released out of the left-side vents 910 and/or circulated through the cooling compartment 920 and out of the right-side events 911. The foregoing openings in the walls of the battery compartment 914 may also serve to vent gases, such as hydrogen, and/or other byproducts produced by the batteries and/or related equipment held within the battery compartment 914. The pulled air flow through the battery compartment 914, in contrast to the pushed air flow in the other cabinet embodiments, provides another manner to vary the cooling provided to the various compartments of the cabinet 900, such as the battery compartment 914 and the electronics compartment 912.

It is emphasized that the above-described embodiments of the present invention are merely possible examples of implementations set forth for a clear understanding of the principles of the invention. Many variations and modifications may be made to the above-described embodiment(s) of the invention without departing substantially from the spirit and principles of the invention. For example, the above-described embodiments of the cabinets 100, 200, 300, 400, 500, 600, 700, 800 and 900 may include one or more doors in various locations and configurations, one or more vents in various locations and arrangements, and additional compartments in various locations and configurations. Further, the compartments of the foregoing cabinets, for example the electronics compartment 112, 212, 312, 412, 512, 612, 712, 812 and 912, may be cooled by various combinations of the above described features, such as natural convection, conduction, heat exchanging elements, and/or forced air (e.g., caused by internal and/or external fans). All such modifications and variations are intended to be included herein within the scope of this disclosure and the invention, and protected by the following claims.

Therefore, having thus described the invention, at least the following is claimed:

1. A weatherproof cabinet with variably cooled compartments, comprising:

a housing having at least a top wall, a bottom wall, a left wall, a right wall, and a rear wall, wherein at least one of said walls includes at least one vent;

a door at least partially attached to said housing, wherein said door provides a front wall for at least part of said housing;

a cooling compartment disposed within said housing;

an electronics compartment, adapted to house electronics, disposed within said cooling compartment and having at least a top wall, a bottom wall, a left wall, and a right wall which are separate from said walls of said housing;

a battery compartment, adapted to house at least one battery, disposed within said housing, wherein said battery compartment includes at least one opening for the through-flow of air from within said housing;

a first fan disposed within said housing, adapted to transfer air between the cooling compartment and a space external to the housing;

a second fan disposed within said electronics compartment and configured to cause air to circulate within said electronics compartment.

2. The weatherproof cabinet of claim 1, wherein said left wall and said right wall each include at least one vent, and said first fan is configured to cause the flow of air through said at least one vent of said left wall into said cooling compartment, through said opening in said battery compartment into said battery compartment, and through said at least one vent of said right wall out of said cooling compartment.

3. The weatherproof cabinet of claim 1, wherein said door is double-walled and has an outer wall and an inner wall, wherein said outer wall provides a front wall to at least part of said housing and said inner wall provides a front wail to at least part of said electronics compartment.

4. The weatherproof cabinet of claim 1, further comprising a cable entrance compartment disposed within said housing, wherein said cable entrance compartment includes at least one opening for the through-flow of air between said battery compartment and said cooling compartment and at least one opening for the routing of cables into said cabinet.

* * * * *